(12) United States Patent
Miki

(10) Patent No.: US 9,356,161 B2
(45) Date of Patent: May 31, 2016

(54) SEMICONDUCTOR DEVICE AND METHOD OF MANUFACTURING SEMICONDUCTOR DEVICE

(71) Applicant: Sony Corporation, Tokyo (JP)

(72) Inventor: Tomoko Miki, Kagoshima (JP)

(73) Assignee: Sony Corporation, Tokyo (JP)

( * ) Notice: Subject to any disclaimer, the term of this patent is extended or adjusted under 35 U.S.C. 154(b) by 91 days.

(21) Appl. No.: 14/159,066

(22) Filed: Jan. 20, 2014

(65) Prior Publication Data

US 2014/0210030 A1    Jul. 31, 2014

(30) Foreign Application Priority Data

Jan. 25, 2013    (JP) .................................. 2013-012380

(51) Int. Cl.
*H01L 31/0232*    (2014.01)
*H01L 31/0216*    (2014.01)
*H01L 27/146*    (2006.01)

(52) U.S. Cl.
CPC .... *H01L 31/02167* (2013.01); *H01L 27/14621* (2013.01); *H01L 27/14685* (2013.01); *Y02E 10/50* (2013.01)

(58) Field of Classification Search
CPC ...................... H01L 31/02167; H01L 31/0232; H01L 31/02327; H01L 27/12621; H01L 27/14685; Y02E 10/50
USPC ............. 257/432, 439, 440, E31.121; 438/70
See application file for complete search history.

(56) References Cited

U.S. PATENT DOCUMENTS

| | | | | |
|---|---|---|---|---|
| 5,371,397 A | * | 12/1994 | Maegawa | H01L 27/14627 257/229 |
| 6,093,484 A | * | 7/2000 | Oguma | 428/312.2 |
| 6,259,083 B1 | * | 7/2001 | Kimura | 250/208.1 |
| 7,507,945 B2 | * | 3/2009 | Kuroiwa | 250/208.1 |
| 2007/0017567 A1 | * | 1/2007 | Gronet et al. | 136/246 |
| 2009/0166518 A1 | * | 7/2009 | Tay et al. | 250/227.11 |
| 2010/0090303 A1 | * | 4/2010 | Takizawa | 257/432 |

FOREIGN PATENT DOCUMENTS

JP    04-73968 A    3/1992
JP    2000-347023 A    12/2000

\* cited by examiner

*Primary Examiner* — Colleen A Matthews
*Assistant Examiner* — Colleen E Snow
(74) *Attorney, Agent, or Firm* — Sheridan Ross P.C.

(57) ABSTRACT

A semiconductor device includes: a photoelectric conversion section made of semiconductor; a color filter made of an inorganic material to which a metal ion is added; and a getter film formed between the photoelectric conversion section and the color filter and configured to trap the metal ion.

13 Claims, 15 Drawing Sheets

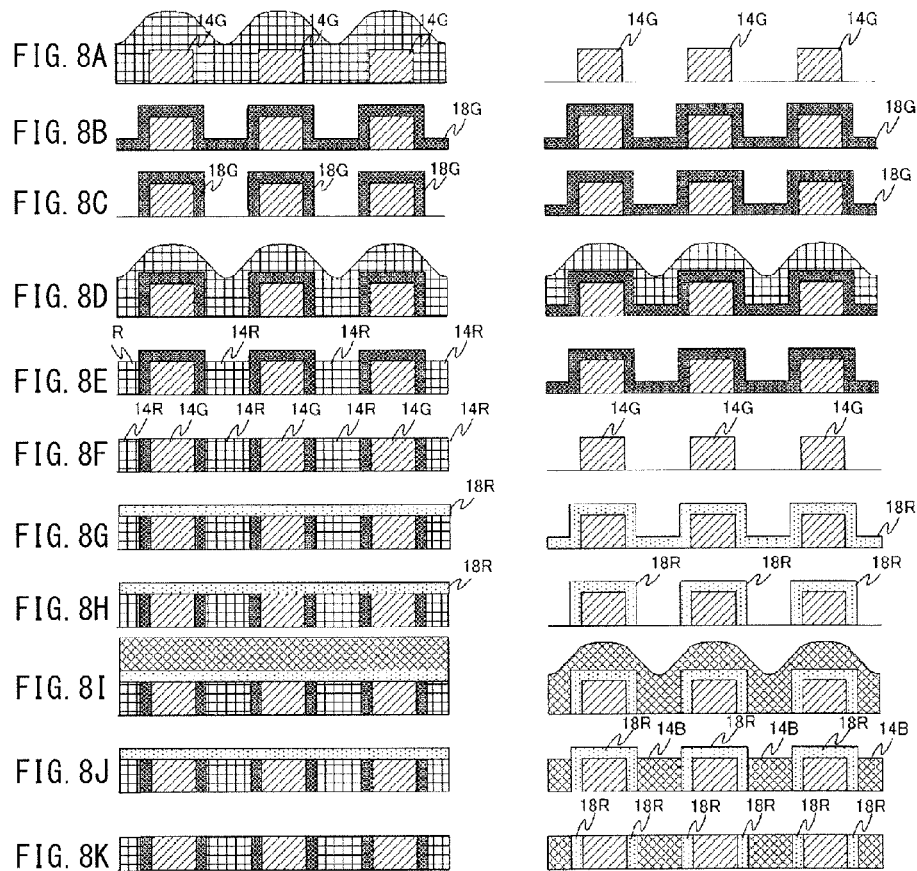
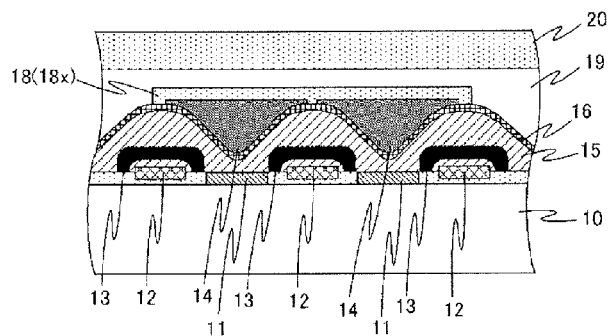
FIG. 9

SEMICONDUCTOR DEVICE AND METHOD OF MANUFACTURING SEMICONDUCTOR DEVICE

CROSS REFERENCE TO RELATED APPLICATIONS

This application claims the benefit of Japanese Priority Patent Application JP 2013-12380 filed on Jan. 25, 2013, the entire contents of which are incorporated herein by reference.

BACKGROUND

The present technology relates to a semiconductor device and to a method of manufacturing a semiconductor device.

A color image sensor such as a CCD color image sensor and a COMS color image sensor has included a color filter between a light-entrance section and a photoelectric conversion section. The color filter is formed by coating with, exposing, and developing a color resist containing a pigment or a dye of a necessary color by a photolithography technology.

However, since the color filter formed by the photolithography with the use of the color resist is weak against high heat, the color filter gets burned at around 300 deg C. Therefore, after the color filter is formed, a high-temperature process is not allowed to be used.

For example, a photoelectric conversion element section, a wiring section, an inorganic lens section, a passivation film, and the like in a typical structure of the CMOS color image sensor are sections for formation of which a high-temperature process is necessary. Therefore, it is necessary to form a color filter after the formation of the photoelectric conversion element section, the wiring section, the inorganic lens section, the passivation film, and the like. As a result, the color filter is formed in a layer above the foregoing sections.

In addition thereto, since the color filter formed by the photolithography with the use of the color resist has low light resistance, the color filter may be discolored after operation for a long time. Further, according to a size and an aggregation state of a coloring matter (a pigment or a dye) dispersed in the resist, a defect such as a minor black-dot defect may occur.

As technologies to resolve the foregoing disadvantages, Japanese Unexamined Patent Application Publication Nos. H04-73968 (JP H04-73968A) and 2000-347023 (JP 2000-347023A) have been disclosed.

JP H04-73968A discloses a technology for forming a colored glass to become a color filter film by a vapor-phase deposition method such as a low-pressure CVD method or a coating method with the use of alkoxysilane and organic metal. The colored glass contains silicon oxide as a main component, and includes a metal element such as Au, Cu, Se, Cd, Fe, Cr, and Co; or a compound such as an oxide, a sulfide, and a halide of any of these metal elements as a colorant.

JP 2000-347023A discloses a technology for doping an inorganic material film having a transparent inorganic oxide such as aluminum oxide as a main component with a predetermined dose amount of a transition metal by a sputtering method or a CVD method. As a doping transition metal, chromium for a red color filter, beryllium and silicon for a green filter, and titanium and iron for a blue color filter are exemplified.

SUMMARY

In the foregoing existing technology, although using the colored glass as a color filter film is disclosed, no consideration is made for disadvantages occurring in the case of using the colored glass as a color filter film of a semiconductor device including a photoelectric conversion section.

It is desirable to make consideration for disadvantages occurring in the case of using a colored glass as a color filter film of a semiconductor device including a photoelectric conversion section, and to provide a semiconductor device and a method of manufacturing a semiconductor device, in which one or more of the disadvantages are resolved.

According to an embodiment of the present technology, there is provided a semiconductor device including: a photoelectric conversion section made of semiconductor; a color filter made of an inorganic material to which a metal ion is added; and a getter film formed between the photoelectric conversion section and the color filter and configured to trap the metal ion.

According to an embodiment of the present technology, there is provided a method of manufacturing a semiconductor device, the method including: forming a photoelectric conversion section made of semiconductor; forming a color filter with use of an inorganic material to which a metal ion is added; and forming a getter film between the photoelectric conversion section and the color filter, the getter film being configured to trap the metal ion.

The above-described semiconductor device according to the above-described embodiment of the present technology includes various examples such as an example in which the semiconductor device is carried out in a state of being built into other device and an example in which the semiconductor device is carried out together with other method. Further, the present technology may be embodied as a method of manufacturing a semiconductor device having steps corresponding to the above-mentioned semiconductor device; a device of manufacturing a semiconductor device for achieving the above-mentioned method of manufacturing the semiconductor device; a program that enables a computer to achieve a function corresponding to a configuration of the above-mentioned device of manufacturing the semiconductor device; a recording medium capable of reading from a computer in which the above-mentioned program is recorded; or the like.

According to the above-described embodiments of the present technology, one or more of disadvantages occurring in the case of using a colored glass as a color filter film of a semiconductor device including a photoelectric conversion section are resolved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 8A to 8K are diagrams schematically illustrating cross-sections of the color filters in respective manufacturing steps of FIG. 7.

FIG. 9 is a schematic view cross-sectionally illustrating a state of the color image sensor in the respective steps of the manufacturing method illustrated in FIG. 2.

DETAILED DESCRIPTION

Some embodiments of the present technology will be described below in the following order.
1. First Embodiment of Semiconductor Device
2. Second Embodiment of Semiconductor Device
3. Other Embodiments
4. Conclusion

1. First Embodiment

Figure 1:
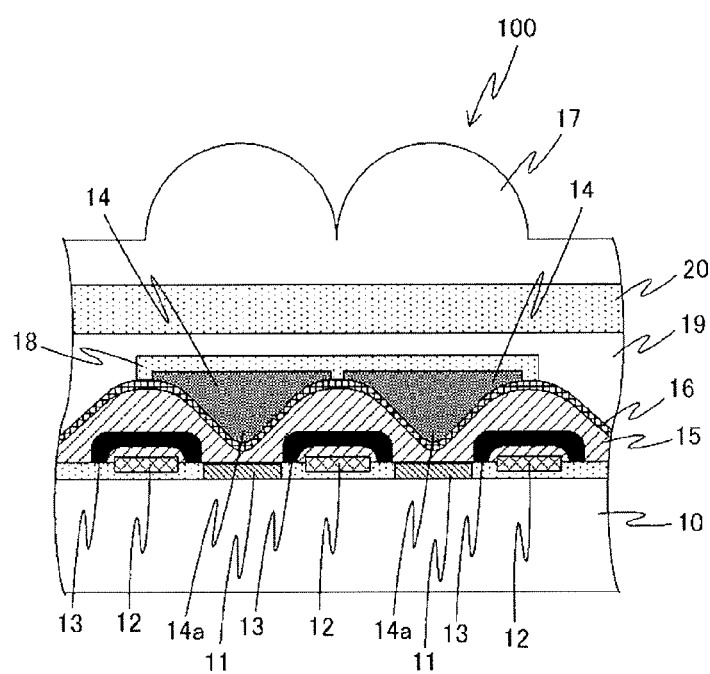
FIG. 1 is a diagram illustrating a color image sensor according to a first embodiment of the present technology.

FIG. 1 is a diagram illustrating a structure of a color image sensor according to a first embodiment of the present technology. As illustrated in FIG. 1, in a color image sensor 100, photoelectric conversion sections 11 and transfer sections 12 are formed alternately in a lateral direction on a substrate 10. On each of the transfer sections 12, a light-blocking film 13 is formed. It is enough that the light-blocking film 13 is made of a material to block light. However, the light-blocking film 13 may be preferably formed of a metal film or an alloy film that has high light-blocking characteristics and that is allowed to be precisely processed by microfabrication such as etching.

In contrast, in a layer above the photoelectric conversion sections 11, color filters 14 are formed. In this embodiment, the color filter 14 is a metal-containing oxide film obtained by adding a metal component to an oxide film made of an inorganic material. The color filter 14 formed of the metal-containing oxide film may be fabricated by various methods, and may be fabricated by, for example, with the use of an after-mentioned TEOS apparatus.

The metal component introduced into the oxide film of the color filter 14 is selected as appropriate according to a desirable color to be achieved by the color filter 14. Specifically, for example, a color filter of a desirable color may be achieved by adding a metal component at the composition ratio disclosed in http://www.nittech.co.jp/E04/E0404.html or at the composition ratios disclosed in Japanese Unexamined Patent Application Publication Nos. H10-61169 and 2000-103644.

A getter film 15 and a diffusion preventive film 16 are formed in order between the photoelectric conversion sections 11 and the color filters 14. The getter film 15 may be formed of, for example, a BPSG film (Boron Phosphor Silicate Glass film) or a PSG film (Phosphor Silicate Glass film). The diffusion preventive film 16 may be formed of, for example, an insulating film such as an SiN film and an SiON film.

The getter film 15 has a gettering function to trap an impurity, and also has a function to trap a metal ion. Therefore, even if metal ions of the color filters 14 are diffused toward the photoelectric conversion sections 11, the getter film 15 traps the metal ions, and the metal ions are prevented from being diffused toward the photoelectric conversion sections 11. Thus, metal contamination of the photoelectric conversion sections 11 is prevented.

Further, the diffusion preventive film 16 is dense and is hardly permeable to water, an impurity, etc., and serves as a stopper against metal ions. Therefore, the metal ions in the color filters 14 are prevented from being diffused by the diffusion preventive film 16, and the metal ions are less likely to be diffused toward the getter film 15 and the photoelectric conversion sections 11. Therefore, metal contamination of the photoelectric conversion sections 11 is prevented more securely.

Further, the getter film 15 and the diffusion preventive film 16 are formed in order from the photoelectric conversion sections 11 side. The diffusion preventive film 16 is formed on the side closer to the color filters 14, and the getter film 15 is formed on the side farther from the color filters 14 (on the side closer to the photoelectric conversion sections 11). At this time, compared to in a case where the foregoing position relation is reversed, the number of metal ions reaching the getter film 15 is decreased, and the trap function of the getter film 15 is effectively utilized.

In a layer above the respective color filters 14, respective on-chip lenses 17 are formed. Although the on-chip lens 17 may be made of an organic material, the on-chip lens 17 is formed of an oxide film made of an inorganic material in this embodiment. The on-chip lens 17 made of the inorganic material may be formed of the foregoing oxide film made of the inorganic material, and may be fabricated, for example, with the use of the after-mentioned TEOS apparatus. It is to be noted that, in the case where the on-chip lens 17 is formed of an organic material, as described above in BACKGROUND, the color filter is fabricated with the use of a color resist.

Between the color filters 14 and the on-chip lenses 17, diffusion preventive film 18 and a getter film 19 are formed in order from the side closer to the color filters 14. It is to be noted that, in the example illustrated in FIG. 1, an SiN film serving as a passivation film 20 is further formed between the getter film 19 and the on-chip lenses 17.

By providing the getter film 19 between the color filters 14 and the on-chip lenses 17, the getter film 19 traps metal ions diffusing from the color filters 14 toward the on-chip lenses 17. Thereby, diffusion of the metal ions toward the on-chip lenses 17 is prevented, and metal contamination of the on-chip lenses 17 is prevented.

Further, by interposing the diffusion preventive film 18 between the color filters 14 and the on-chip lenses 17, diffusion of the metal ions contained in the color filters 14 is blocked by the diffusion preventive film 18, and thereby, the metal ions are less likely to be diffused into the getter film 19 and the on-chip lenses 17. Thereby, metal contamination of the on-chip lenses 17 is prevented more securely.

Further, the diffusion preventive film 18 is formed in a position closer to the color filters 14, and the getter film 19 is formed in a position closer to the on-chip lenses 17. Thereby, compared to in a case where the foregoing position relation between the getter film 19 and the diffusion preventive film 18 is reversed, the number of metal ions reaching the getter film 19 is decreased, and the gettering function of the getter film 19 is effectively utilized.

Further, the foregoing diffusion preventive film 18 is interposed between the color filters 14 adjacently provided, and thereby, a metal ion contained in one of the foregoing adjacent color filters 14 is prevented from being diffused into the other of the foregoing adjacent color filters 14. It is to be noted that the getter film 19 may be formed to be interposed between the color filters 14 adjacently provided, and thereby, metal ions diffused between the foregoing adjacent color filters 14 may be trapped.

In top surfaces of the getter film 15 and the diffusion preventive film 16 that are formed above the transfer sections 12 and the photoelectric conversion sections 11, recessed portions each having a mortar-like cross-section are formed. Each of the recessed portions gradually sinks toward a substantial center in a horizontal direction of the photoelectric conversion section 11. The top surfaces of the getter film 15 and the diffusion preventive film 16 are closer to the photoelectric conversion sections 11 than to the transfer sections 12. Each of the color filters 14 is formed so that the center thereof substantially corresponds with the foregoing recessed portion.

That is, in each of the color filters 14, a mound-like convex section 14*a* projecting toward the photoelectric conversion section 11 is formed on the bottom surface of the color filter 14 in a region opposing to the photoelectric conversion section 11. Therefore, compared to a case where both top and bottom surfaces of the color filters 14 are formed flatly, a distance from a region where each of the color filters 14 is closest to the photoelectric conversion section 11 to the top surface of the color filter is allowed to be larger.

Thereby, compared to the case where both the top and bottom surfaces of the color filters 14 are formed flatly, a distance from a top surface of the diffusion preventive film 16 to the top surface of each of the color filters 14 is reduced, and the total thickness of the color image sensor 100 is decreased thereby.

Further, since each of the color filters 14 is formed further closer to the photoelectric conversion section 11, color mixture between the color filters 14 adjacent to each other is prevented.

As described above, the color filter 14 according to this embodiment is made of the metal-containing oxide film obtained by adding the metal component to the inorganic material, and the getter films 15, 19 and the diffusion preventive films 16 and 18 are formed as appropriate between the color filters 14 and the various elements in the periphery thereof. Therefore, metal contamination of the various elements due to the metal ions of the color filters 14 is prevented.

2. Second Embodiment

Figure 2:
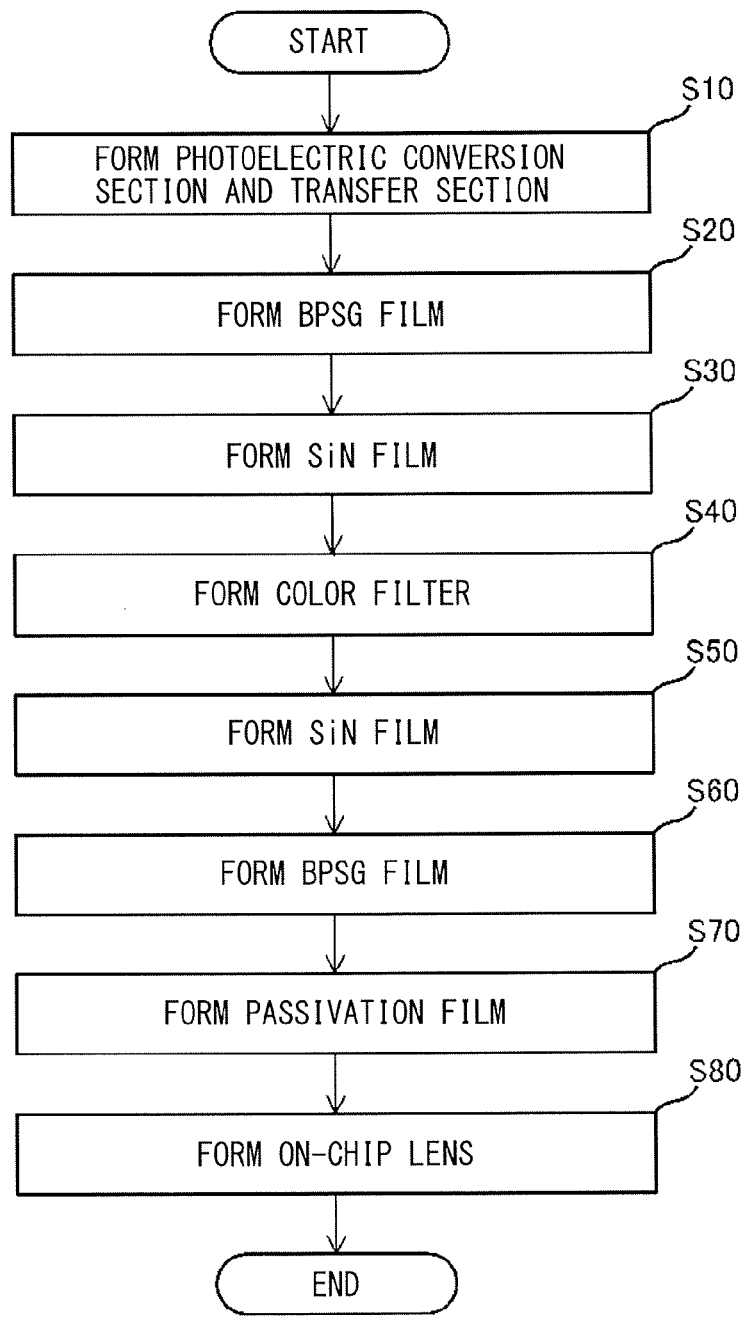
FIG. 2 is a flowchart illustrating a flow of a method of manufacturing the color image sensor illustrated in FIG. 1.

Next, description will be given of a method of manufacturing the color image sensor 100 according to the foregoing first embodiment. FIG. 2 is a flowchart illustrating a flow of the method of manufacturing the color image sensor 100 illustrated in FIG. 1. FIGS. 3 to 5, 9, and 10 are schematic views cross-sectionally illustrating states of the color image sensor 100 in respective steps of the manufacturing method illustrated in FIG. 2.

In the manufacturing method illustrated in FIG. 2, first, the photoelectric conversion sections 11 and the transfer sections 12 are formed on the substrate 10 (S10). The photoelectric conversion sections 11 and the transfer sections 12 may be formed by any of publicly-known various manufacturing methods. The photoelectric conversion sections 11 and the transfer sections 12 are formed alternately in the horizontal direction of FIG. 1.

In each of the photoelectric conversion sections 11, a plurality of photoelectric conversion elements are lined in a depth direction of FIG. 1. Each of the photoelectric conversion elements may be, for example, a PN-junction photodiode, and is allowed to generate a signal electric charge according to a light-receiving amount by photoelectrically converting received light.

The transfer section 12 is a so-called vertical transfer resister, and is configured of a CCD (Charge Coupled Device) in which a plurality of electrodes are lined in the depth direction of FIG. 1 on the oxide film on the surface of the substrate 10. The transfer section 12 applies a voltage to each of the plurality of electrodes, and one voltage given to one electrode is different from another voltage given to another electrode adjacent to the one electrode. Thereby, the transfer section 12 forms a potential barrier between the electrodes, and retains an electric charge in each electrode. The light-blocking film 13 is formed on the transfer section 12.

Figure 3:
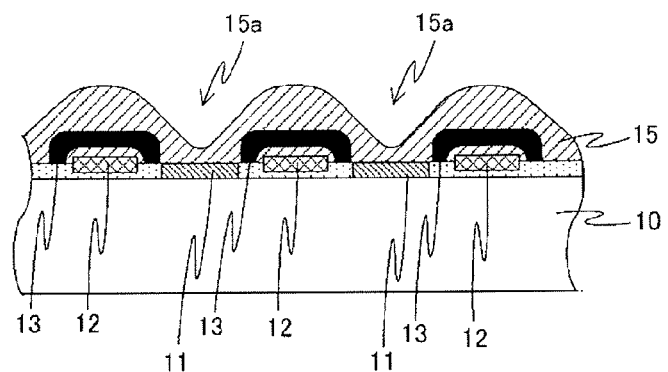
FIG. 3 is a schematic view cross-sectionally illustrating a state of the color image sensor in a step of the manufacturing method illustrated in FIG. 2.

Next, a BPSG film as the getter film 15 is formed on the photoelectric conversion sections 11 and the transfer sections 12 as illustrated in FIG. 3 (S20). However, since the light-blocking film 13 is formed on the transfer section 12, and therefore, the transfer section 12 is higher than the photoelectric conversion section 11. Therefore, the photoelectric conversion section 11 is recessed compared to regions on both sides of the photoelectric conversion section 11 (formation ranges of the transfer sections 12 and the light-blocking films 13)

Therefore, in the case where CMP (Chemical Mechanical Polishing) or the like for flattening the surface of the getter film 15 is not performed, the getter film 15 formed on the photoelectric conversion sections 11 and the transfer sections 12 has concave sections 15*a* that sink toward the photoelectric conversion sections 11 in a mortar-like shape.

Figure 4:
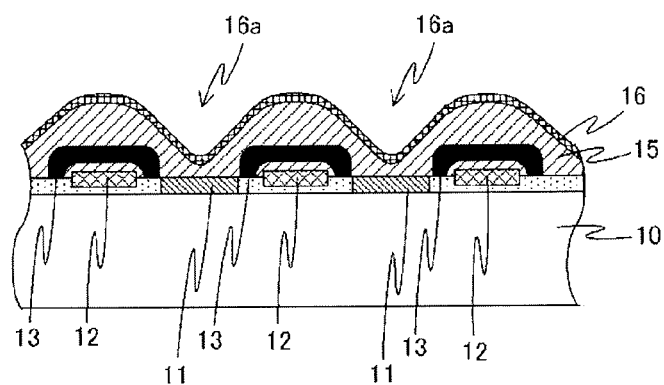
FIG. 4 is a schematic view cross-sectionally illustrating a state of the color image sensor in a step of the manufacturing method illustrated in FIG. 2.

Next, as illustrated in FIG. 4, an SiN film serving as the diffusion preventive film 16 is formed on the getter film 15 (S30). Again, in the case where CMP (Chemical Mechanical Polishing) or the like for flattening the surface of diffusion preventive film 16 is not performed, concave sections 16*a* that sink toward the photoelectric conversion sections 11 in a mortar-like shape are formed in positions corresponding to the respective photoelectric conversion sections 11.

Figure 5:
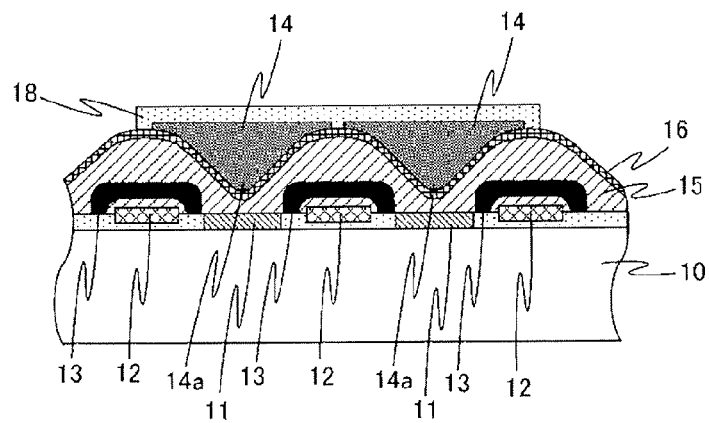
FIG. 5 is a schematic view cross-sectionally illustrating a state of the color image sensor in a step of the manufacturing method illustrated in FIG. 2.

Next, as illustrated in FIG. 5, the color filters 14 are formed on the diffusion preventive film 16 (S40). In this example, since the diffusion preventive film 16 has the concave sections 16*a*, in each of the color filters 14 a convex section 14*a* having a mound-like cross-section projecting toward the photoelectric conversion section 11 on the bottom surface of the color filter 14 in a region opposing to the photoelectric conversion section 11.

The color filters 14 are formed by a coating method (coating with liquid (such as spin coating, dip coating, and spray coating) and curing). In this embodiment, description will be given by taking a case of forming the color filters 14 by a sol-gel method as one of the coating methods as an example.

Further, in this embodiment, in particular, description will be given by taking a case of forming the color filters 14 with the use of the TEOS apparatus in a CVD step as a step of forming an oxide film used for semiconductors as an example. It is to be noted that TEOS refers to tetraethoxysilane as a liquid source of a raw material in the CVD step performed with the use of the TEOS apparatus.

Figure 6:
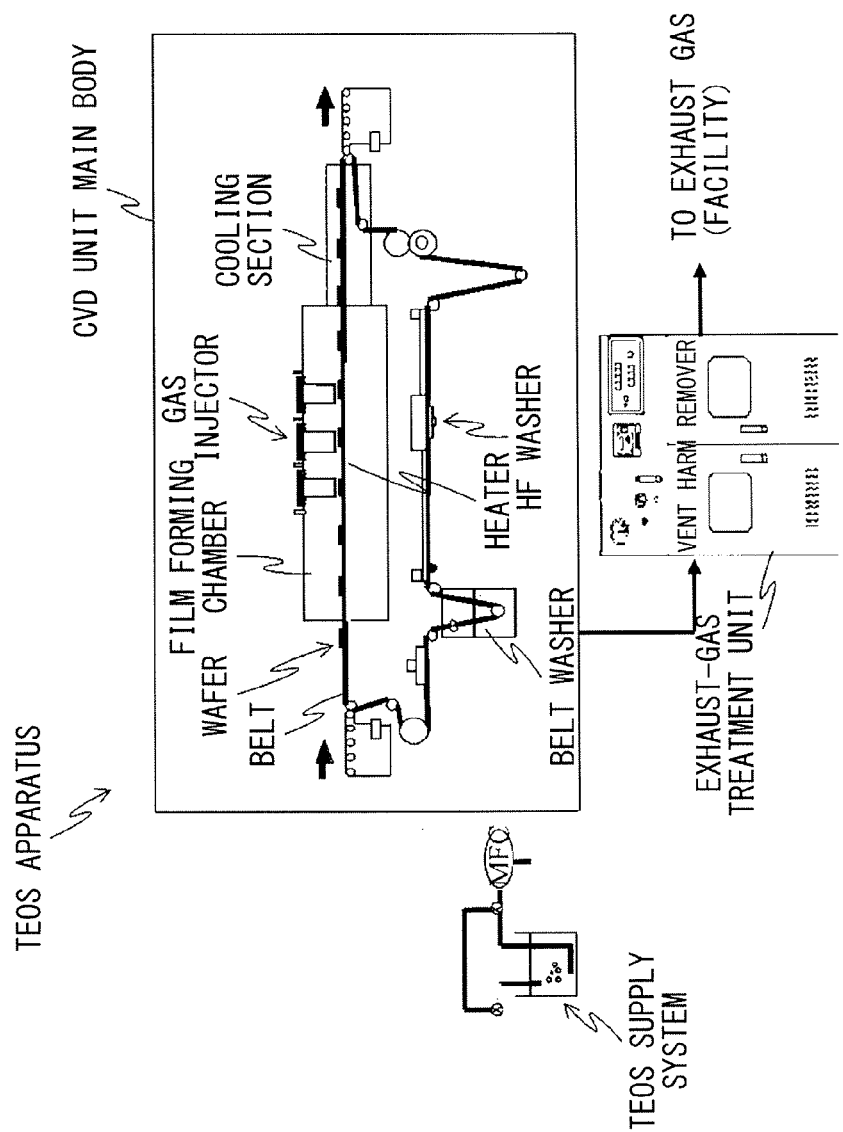
FIG. 6 is a diagram illustrating an outline of a TEOS apparatus when the color filter is formed.

FIG. 6 is a diagram illustrating an outline of the TEOS apparatus when the color filters 14 are formed. As illustrated in FIG. 6, in the TEOS apparatus according to this embodiment, while the substrate 10 on which the photoelectric conversion sections 11 and the transfer sections 12 are formed is carried through a film-forming chamber by a carrier device such as a belt conveyer, and the surface of the substrate 10 (wafer) is coated with a film-forming material supplied from a TEOS supply system with the use of a gas injector in the film-forming chamber.

The film-forming material is solution in which a raw material is dissolved or dispersed. As the film-forming material, solution in which metal alkoxide is mixed with a TESO source is used. Examples of an alkoxide group of the metal alkoxide may include an alkoxide group corresponding to various alcohols such as ethanol, methanol, and isopropanol. An ethoxy group of the TEOS source may be any of various alkoxide groups. Not only tetraethoxysilane, but also tetraalkoxysilane may be used. Since TEOS is liquid at ordinary temperature and pressure, in general, TEOS is subjected to bubbling with the use of carrier gas and is supplied to a gas injector.

A metal ion of the metal alkoxide is selected so that a predetermined metal ion is contained at an appropriate compounding ratio according to a desired color of the color filter 14. As a type of the metal ion, for example, Au, Cu, Co, or Se+Cd may be used in the case of forming a red color filter; Co or Cu may be used in the case of forming a blue color filter; and Cr, Fe, or Cu may be used in the case of forming a green color filter.

The TEOS source and the metal alkoxide are changed to an amorphous film of a silicon oxide containing metal and ethanol as a reaction by-product by the hydrolysis reaction represented by the following Formula (I) on the substrate 10. It is to be noted that EtO shown in the following Formula (I) represents an ethoxy group ($C_2H_5$—O—). It is to be noted that, in the following Formula (I), a case where metal of the metal alkoxide is a copper (Co) ion is exemplified.

[Formula 1]

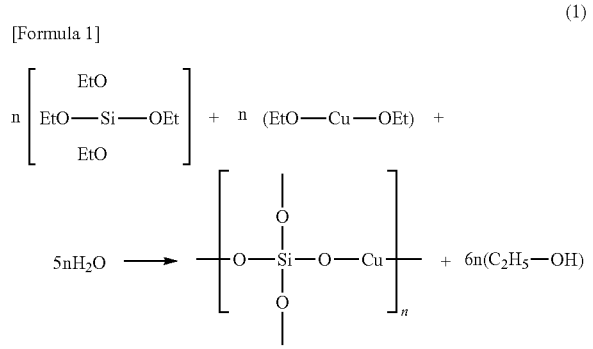

Thereafter, as necessary, for example, the amorphous film of the metal-containing silicon oxide may be heated up to about 400 deg C. and crystallized, and thereby, metal-containing silicon oxide crystal is formed. However, crystallization may be achieved even at room temperature according to aging conditions after coating. The metal-containing silicon oxide crystal presents color as a glaze does according to a compounding ratio of the metal ion contained in the metal alkoxide.

It is to be noted that the metal-containing silicon oxide film (hereinafter referred to as TEOS-based oxide film) formed with the use of the TEOS apparatus described above has more superior film denseness and more superior coverage, and is more advantageous in generation of particles, compared to a metal-containing silicon oxide film (hereinafter referred to as $SiH_4$-based oxide film) formed with the use of $SiH_4$.

Further, a reaction of the TEOS-based oxide film is strongly influenced by a state of the surface (base) of the substrate. However, the film quality is allowed to be controlled by adjusting the concentration of $O_3$ gas flown therewith, and therefore, a film having fluidity is allowed to be formed even at around 400 deg C. Therefore, the TEOS-based oxide film has higher migration on the surface of the substrate of a reactive intermediate, and has higher embedding capability, compared to the $SiH_4$-based oxide film.

Further, in the case of the TEOS-based oxide film, the amorphous film of the metal-containing silicon oxide is arranged more conformally on the surface of the substrate, compared to the $SiH_4$-based oxide film.

One of the reasons for this may be that while the $SiH_4$-based oxide film is formed by a vapor-phase reaction, the TEOS-based oxide film is formed by a surface reaction. That is, in the case of the $SiH_4$-based oxide film, raw material gas is vapor-phase-reacted, a film material as a main product, ethanol as a by-product, and the like are generated. The main product is deposited on the surface of the substrate, and thereby, the $SiH_4$-based oxide film is formed. In contrast, in the case of the TEOS-based oxide film, in a state under normal pressure and with highly-concentrated $O_3$, a hydrophobic polymer is formed in vapor phase, the metal-containing silicon oxide is arranged conformally on the surface of the substrate due to surface absorption and migration. Thereafter, ethanol as a by-product and the like are desorbed, leaving a film material as a main product due to a surface reaction.

Further, since TEOS has no self-sustaining combustion characteristics at normal temperatures, TEOS is stable and may be handled safely. Further, a high-pure TEOS is easily available. In contrast, since $SiH_4$ has self-sustaining combustion characteristics and toxicity, $SiH_4$ needs to be handled with great care.

It is to be noted that, in the foregoing embodiment, the description has been given taking the case of the CVD under normal pressure as an example. However, this is not limitative, and for example, CVD under sub-normal pressure or plasma CVD may be used.

Figure 7:
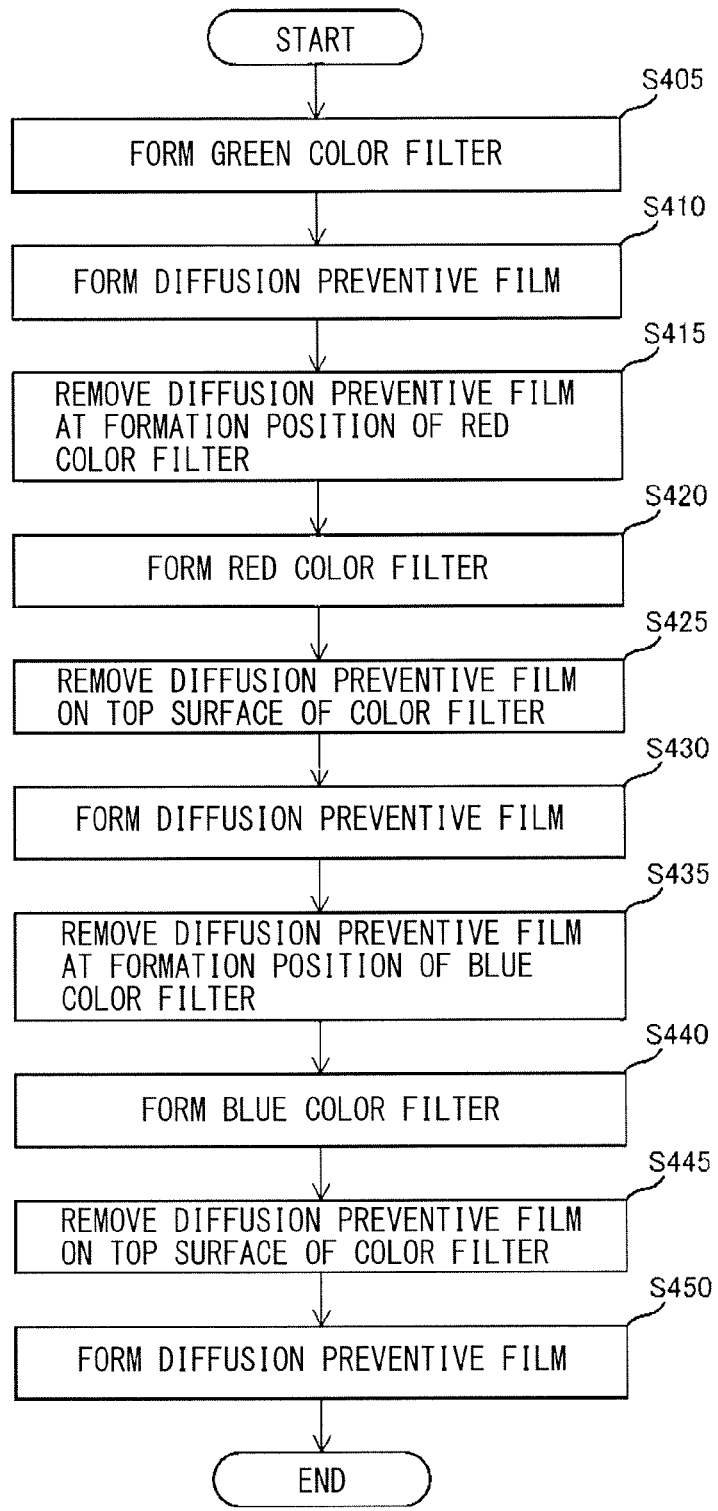
FIG. 7 is a flowchart illustrating a flow of a method of manufacturing color filters of respective colors R, G, and B.

Next, description will be given of a method of manufacturing red (R), green (G), and blue (B) color filters 14 on the same single substrate referring to FIGS. 7 and 8A to 8K. FIG. 7 is a flowchart illustrating a flow of the method of manufacturing the R, G, and B color filters. FIGS. 8A to 8K are diagrams schematically illustrating cross-sections of the color filters in respective manufacturing steps of FIG. 7. It is to be noted that FIGS. 8A to 8K illustrate a case having no convex section 14a is formed in the lower portion of the color filters 14 for convenience in explanation. Further, colors of the respective color filters are not limited to red, green, and blue, and may be variously changed. Arrangement of the respective color filters may be variously changed.

First, in manufacturing the respective R, G, and B color filters, green color filters 14G are formed at respective formation positions of the green color filters 14G (S405). Specifically, a TEOS source mixed with metal alkoxide for green is formed and crystallized on the substrate, and metal-containing oxide crystal is left only in the formation positions of the green color filters 14G with the use of a photolithography technology or a dry etching technology as illustrated in FIG. 8A.

Next, a diffusion preventive film 18G is formed on the green color filters 14G as illustrated in FIG. 8B (S410). Subsequently, as illustrated in FIG. 8C, portions of the diffusion preventive film 18G that are formed at formation positions of red color filters 14R are removed with the use of a photolithography technology or a dry etching technology (S415). At this time, portions of the diffusion preventive film 18G that are formed at formation positions of blue color filters 14B are left as they are.

Next, the red color filters 14R are formed at the respective formation positions of the red color filters 14R (S420). Specifically, as illustrated in FIG. 8D, a TEOS source mixed with metal alkoxide for red is formed and crystallized on the substrate, and metal-containing oxide crystal is left only at the formation positions of the red color filters 14R with the use of a photolithography technology or a dry etching technology as illustrated in FIG. 8E.

Next, portions of the diffusion preventive film 18G that are formed on the color filters 14G and 14R are once removed as illustrated in FIG. 8F (S425). Subsequently, as illustrated in FIG. 8G, a diffusion preventive film 18R is formed again on the color filters 14G and 14R (S430).

Next, as illustrated in FIG. 8H, portions of the diffusion preventive film 18R that are formed at the formation positions of the blue color filters 14B are removed with the use of a photolithography technology or a dry etching technology (S435).

Next, the blue color filters 14B are formed at the respective formation positions of the blue color filters 14B (S440). Specifically, as illustrated in FIG. 8I, a TEOS source mixed with metal alkoxide for blue is formed and crystallized on the substrate, and metal-containing oxide crystal is left only at the formation positions of the blue color filters 14B with the use of a photolithography technology or a dry etching technology as illustrated in FIG. 8J.

Next, portions of the diffusion preventive film 18R that are formed on the color filters 14G and 14R are once removed as illustrated in FIG. 8K, and thereby, the color filters 14 are completed (S445). Thereby, the color filters 14G, 14R, and 14B are respectively formed in predetermined positions in a state that the diffusion preventive films 18G and 18R are formed between side walls of the color filters.

Thereby, color mixture due to diffusion of metal ions between the color filters is prevented. It goes without saying that, if there is no possibility that color mixture would occur, the steps of forming the diffusion preventive films 18G and 18R between the side walls of the color filters 14G, 14R, and 14B may be omitted.

Thereafter, as illustrated in FIG. 9, a diffusion preventive film 18 (18x) is formed again on the color filters 14G, 14R, and 14B (S50), and a BPSG film as the getter film 19 is formed thereon (S60). Subsequently, an SiN film as the passivation film 20 is formed on the getter film 19 (S70).

Figure 10:
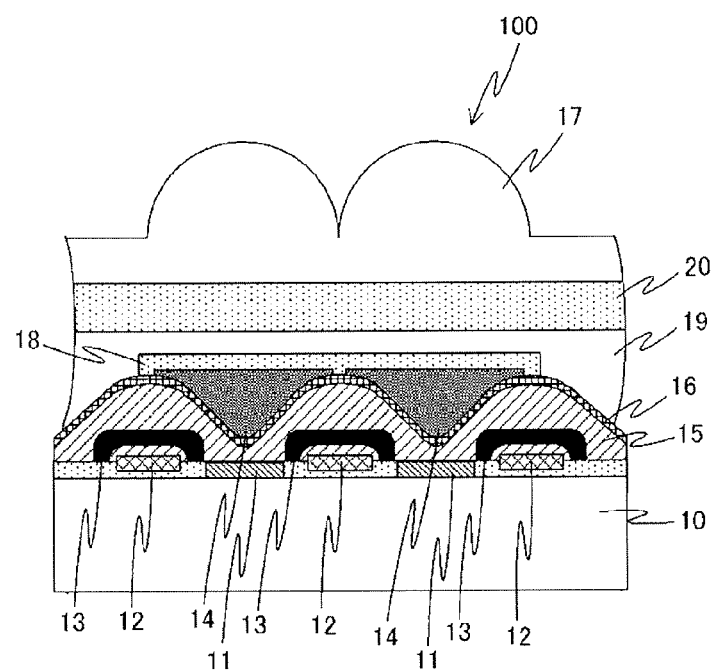
FIG. 10 is a schematic view cross-sectionally illustrating a state of the color image sensor in the respective manufacturing steps of the manufacturing method illustrated in FIG. 2.

Next as illustrated in FIG. 10, the on-chip lenses 17 are formed on the passivation film 20 (S80). The on-chip lenses 17 are formed of an inorganic material with the use of the TEOS apparatus. After a layer of the inorganic material having a thickness equal to or larger than the maximum thickness of the on-chip lenses is formed on the passivation film, shapes of lenses are patterned with the use of a resist, and the resultant is transferred onto the layer of the inorganic material formed by the TEOS apparatus by etchback. By the foregoing manufacturing method, the color image sensor 100 according to the first embodiment described above may be formed.

3. Other Embodiments

The present technology may be applied not only to the foregoing CCD image sensor, but also to CMOS image sensors. Description will be given below of a color filter and structures therearound in the case where an embodiment of the present technology is applied to CMOS image sensors referring to FIGS. 11 to 18. FIGS. 11 to 18 are diagrams schematically illustrating cross-sectional structures of various CMOS image sensors.

As illustrated in FIGS. 11 to 18, in the CMOS image sensors, color filters may be formed in various positions.

3-1. Third Embodiment

Figure 11:
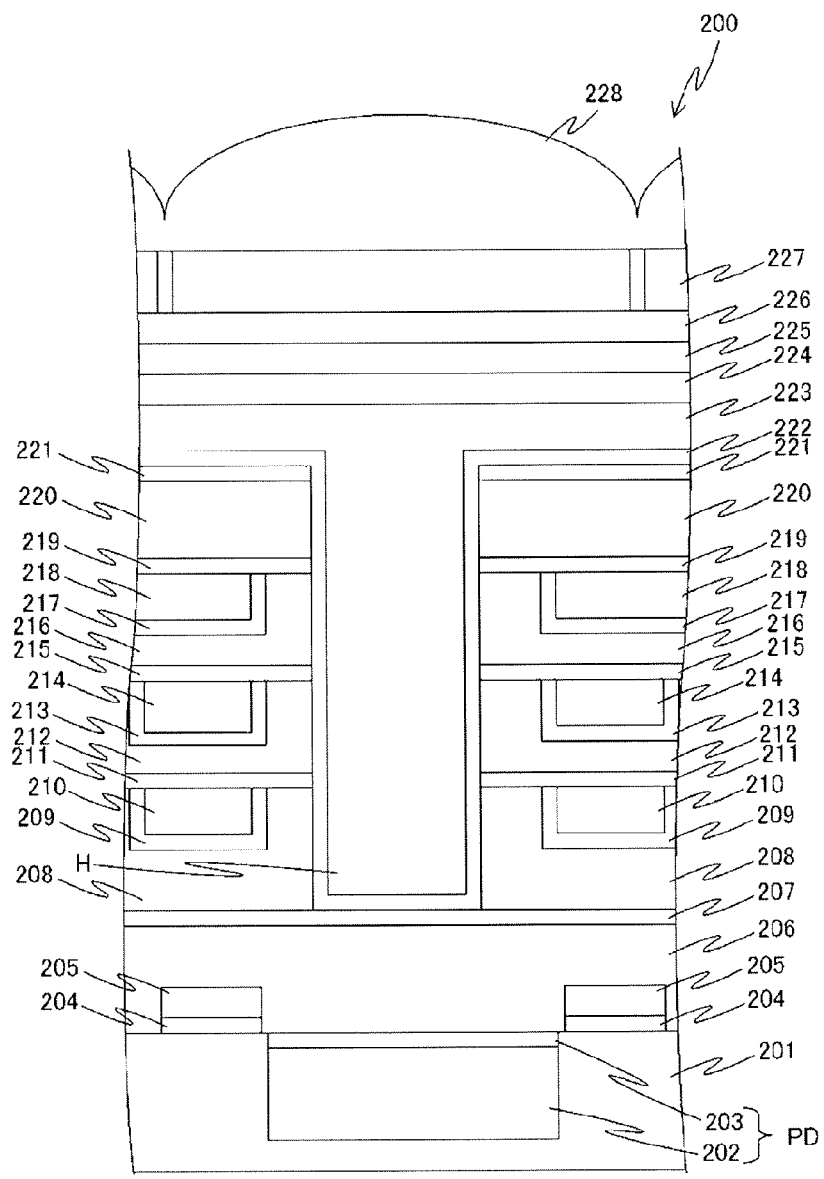
FIG. 11 is a diagram schematically illustrating a cross-sectional structure of a CMOS image sensor.

In a CMOS image sensor 200 illustrated in FIG. 11, an n-type electric charge accumulation layer 202 and a p$^+$-type surface layer 203 located on the surface portion of the n-type electric charge accumulation layer 202 are formed for every pixel in a p-well region of a semiconductor substrate 201, and a photodiode PD is configured by pn junction. Further, adjacently to the photodiode PD, gate insulating films 204 and gate electrodes 205 are formed on the semiconductor substrate 201.

On the semiconductor substrate 201, a first interlayer insulating film 206 made of, for example, silicon oxide is formed to cover the photodiode PD and the gate electrodes 205. Further, in a layer above the first interlayer insulating film 206, an etching stopper film 207 made of silicon carbide (SiC) is formed to cover at least the formation region of the photodiode PD.

In a layer above the etching stopper film 207, for example, a second interlayer insulating film 208, a third interlayer insulating film 212, a fourth interlayer insulating film 216, a fifth interlayer insulating film 220, a first diffusion preventive film 211, a second diffusion preventive film 215, a third diffusion preventive film 219, and an insulating film 221 may be formed.

The second interlayer insulating film 208, the third interlayer insulating film 212, the fourth interlayer insulating film 216, the fifth interlayer insulating film 220, and the insulating film 221 may be formed of, for example, silicon oxide. The first diffusion preventive film 211 and the second diffusion preventive film 215 may be formed of, for example, silicon carbide. The third diffusion preventive film 219 may be formed of, for example, silicon nitride.

In the second interlayer insulating film 208, wiring-use grooves are formed. Barrier metal layers 209 made of a lamination of [tantalum/tantalum nitride] or the like is formed to cover the inner walls of the wiring-use grooves, and first wirings 210 made of copper are formed to be buried into regions inside of the barrier metal layers 209.

Similarly, for example, wiring-use grooves may be also formed in the third interlayer insulating film 212. Barrier metal layers 213 made of a lamination of [tantalum/tantalum nitride] or the like are formed to cover the inner walls of the wiring-use grooves, and second wirings 214 made of copper are formed to be buried into regions inside of the barrier metal layers 213.

Similarly, for example, wiring-use grooves may be also formed in the fourth interlayer insulating film 216. Barrier metal layers 217 made of a lamination of [tantalum/tantalum nitride] or the like are formed to cover the inner walls of the wiring-use grooves, and third wirings 218 made of copper are formed to be buried into regions inside of the barrier metal layers 217. The third wirings 218 also have a function as a light-blocking film.

In a portion above the photodiode PD, in the insulating films layered as described above, a via hole H is formed to penetrate through the second to the fourth interlayer insulating films and the first to the third diffusion preventive films and to reach the etching stopper film 207. For example, the via hole H may reach a portion in the middle of the etching stopper film 207, and the etching stopper film 207 forms a bottom surface of the via hole H.

On the inner wall of the via hole H, a passivation film 222 having a higher refractive index than that (refractive index: 1.45) of silicon oxide is formed. The passivation film 222 may be formed of, for example, silicon nitride (refractive index: 2.0), and has a thickness of about 0.5 μm.

In a layer above the passivation film 222, a buried layer 223 that is buried into the via hole H and that has a higher refractive index than that of the passivation film 222 is formed. The buried layer 223 is buried into the via hole H, and the thickness thereof outside the via hole H is about 0.5 μm.

The buried layer 223 may be made of, for example, a high-refractive index resin such as a siloxane-based resin (refractive index: 1.7) and polyimide, and in particular, may be preferably made of the siloxane-based resin. Such a resin may contain, for example, metal oxide microparticles such as titanium oxide, tantalum oxide, niobium oxide, tungsten oxide, zirconium oxide, zinc oxide, indium oxide, and hafnium oxide, and thereby, the refractive index of the resin is increased. The passivation film 222 and the buried layer 223 that are buried into the via hole H form a light waveguide.

In a layer above the buried layer 223, a fifth interlayer insulating film 224, a getter film 225, a sixth interlayer insulating film 226, color filters 227 of respective colors, and on-chip lenses 228 are formed in order. An inner lens may be further provided between the color filters 227 and the on-chip lenses 228.

The fifth interlayer insulating film 224 and the sixth interlayer insulating film 226 are formed of an SiN film or an SiON film as with the diffusion preventive films 16 and 18 in the foregoing first embodiment. The getter film 225 is formed of a BPSG film or a PSG film as with the getter film 15 in the foregoing first embodiment. Between the color filters 227 of respective colors, an SiN film as an insulating film between the color filters is formed as in the foregoing first embodiment.

As described above, in the CMOS image sensor 200 in which light enters the photodiode PD through the light waveguide formed in the via hole H, the fifth interlayer insulating film 224, the getter film 225, and the sixth interlayer insulating film 226 are formed on the light waveguide side between the light waveguide and the on-chip lenses. Thereby, while the color filters 227 formed of an inorganic material are provided, diffusion of metal ions toward the light waveguide is prevented, and metal contamination of the light waveguide and the like is prevented.

It is to be noted that, in this embodiment, the description has been given of the case in which the via hole H is formed to form the light waveguide to the photodiode PD. However, it goes without saying that, in the case of a CMOS image sensor in which a light waveguide is not formed, color filters made of an inorganic material may be provided as in this embodiment.

3-2. Fourth Embodiment

Figure 12:
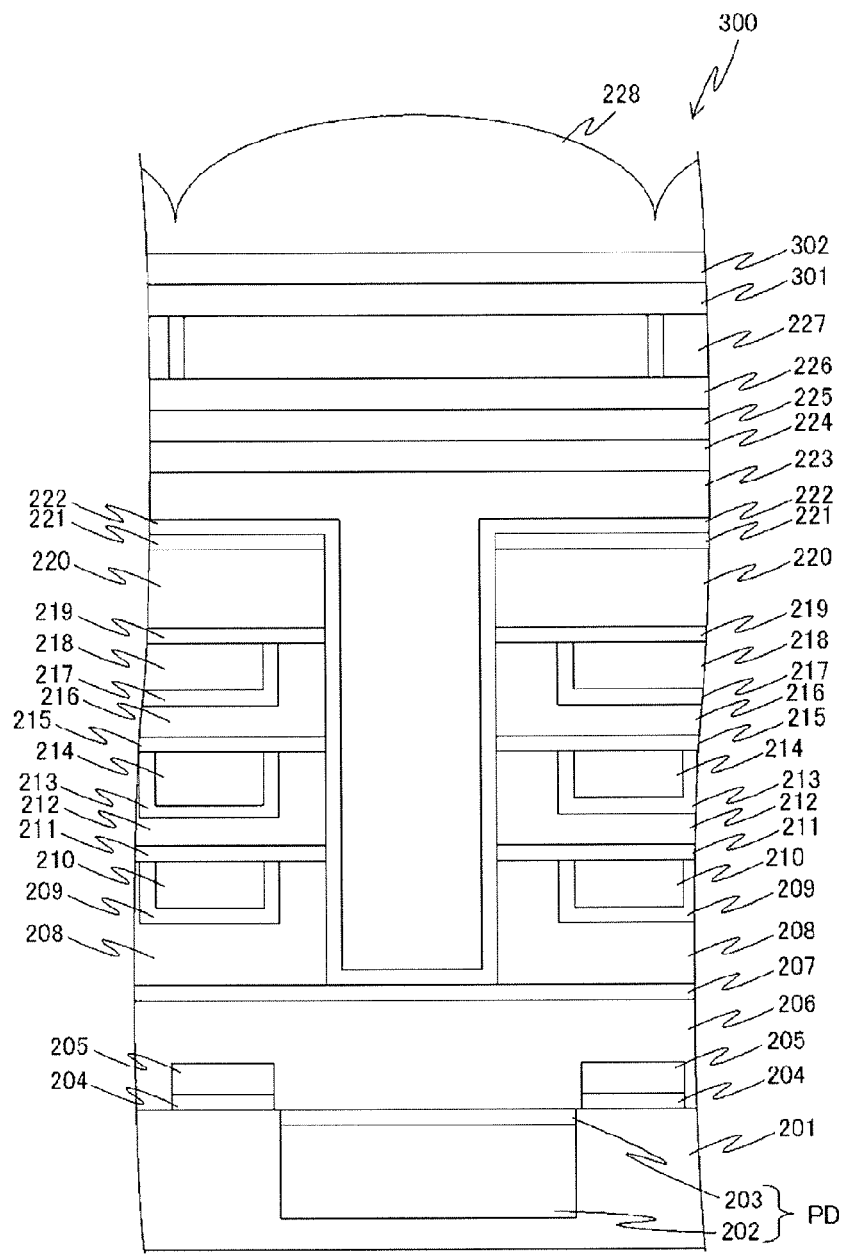
FIG. 12 is a diagram schematically illustrating a cross-sectional structure of a CMOS image sensor.

In a CMOS image sensor 300 illustrated in FIG. 12, an interlayer insulating film 301 and a getter film 302 are formed in order between the color filters 227 and the on-chip lenses 228 in the CMOS image sensor 200 according to the foregoing third embodiment. The interlayer insulating film 301 is formed of an SiN film or an SiON film as with the diffusion preventive films 16 and 18 in the foregoing first embodiment. The getter film 302 is formed of a BPSG film or a PSG film as with the getter film 15 in the foregoing first embodiment.

By further providing the interlayer insulating film 301 and the getter film 302 between the color filters 227 and the on-chip lenses 228 as described above, in the case where the on-chip lenses are formed of an inorganic material as in the foregoing first embodiment, diffusion of metal ions toward the on-chip lenses 228 is prevented, and metal contamination of the on-chip lenses 228 is prevented.

3-3. Fifth Embodiment

Figure 13:
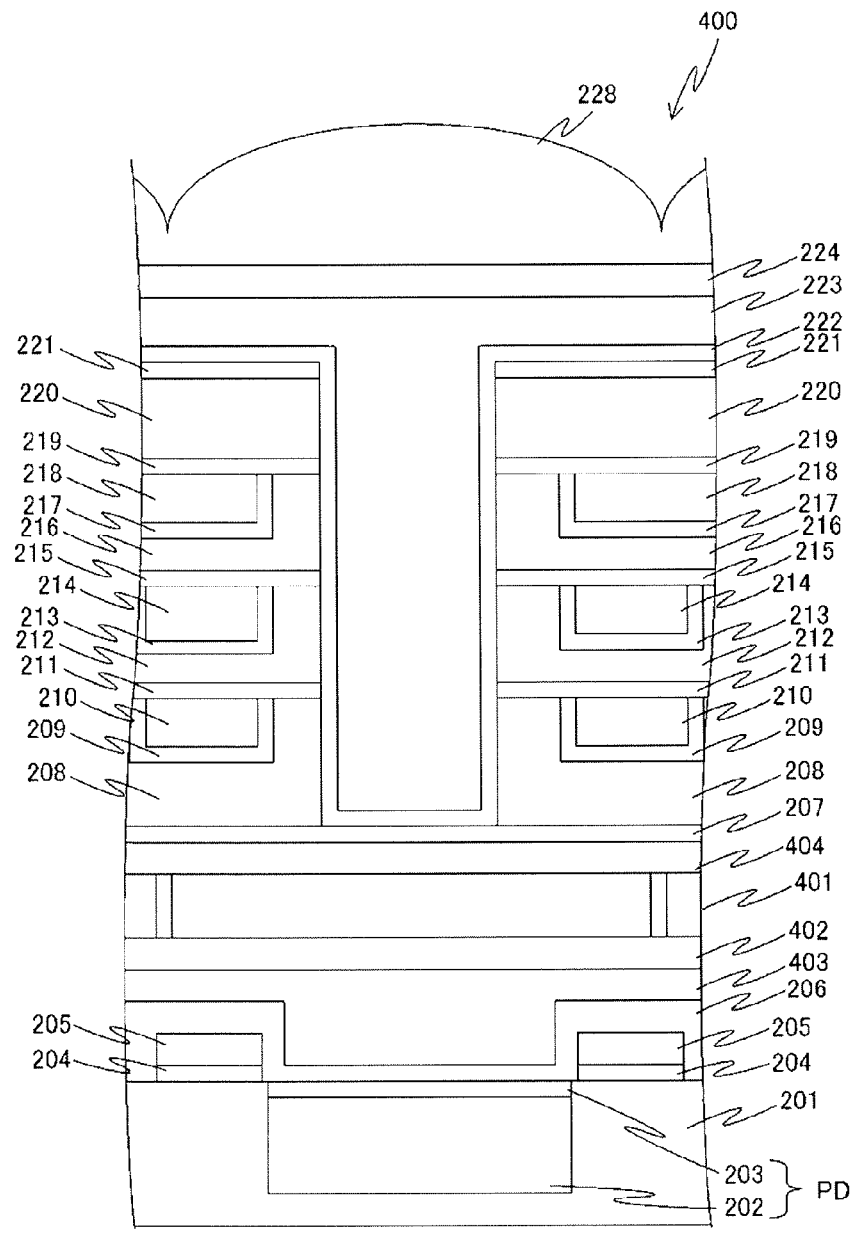
FIG. 13 is a diagram schematically illustrating a cross-sectional structure of a CMOS image sensor.

In a CMOS image sensor 400 illustrated in FIG. 13, the getter film 225, the sixth interlayer insulating film 226, and the color filters 227 of respective colors of the CMOS image sensor 200 according to the foregoing third embodiment are not formed, and color filters 401 are provided between the first interlayer insulating film 206 and the etching stopper film 207. The color filters 401 are formed of an inorganic material as with the color filters 14 according to the first embodiment.

That is, by forming the color filters 401 of the inorganic material, the color filters 401 are allowed to be formed in a layer lower than wiring layers for which a high-temperature process may be necessary. Further, the color filters 401 are formed at positions closer to the photodiode PD than the wiring layers are, and thereby, the CMOS image sensor 400 in which color mixture of light entering the photodiode PD is prevented is achieved.

At this time, a getter film 402 and an interlayer insulating film 403 are formed in order between the first interlayer insulating film 206 and the color filters 401, and a getter film 404 is also provided between the color filters 401 and the etching stopper film 207. The interlayer insulating film 403 is formed of an SiN film or an SiON film as with the diffusion preventive films 16 and 18 in the foregoing first embodiment. The getter films 402 and 404 are formed of a BPSG film or a PSG film as with the getter film 15 in the foregoing first embodiment.

By providing the getter film 402, the interlayer insulating film 403, and the getter film 404 as described above, diffusion of metal ions from the color filters 401 into the photodiode PD on the lower layer side and the wiring layers and the like on the upper layer side is prevented, and metal contamination is prevented.

3-4. Sixth Embodiment

Figure 14:
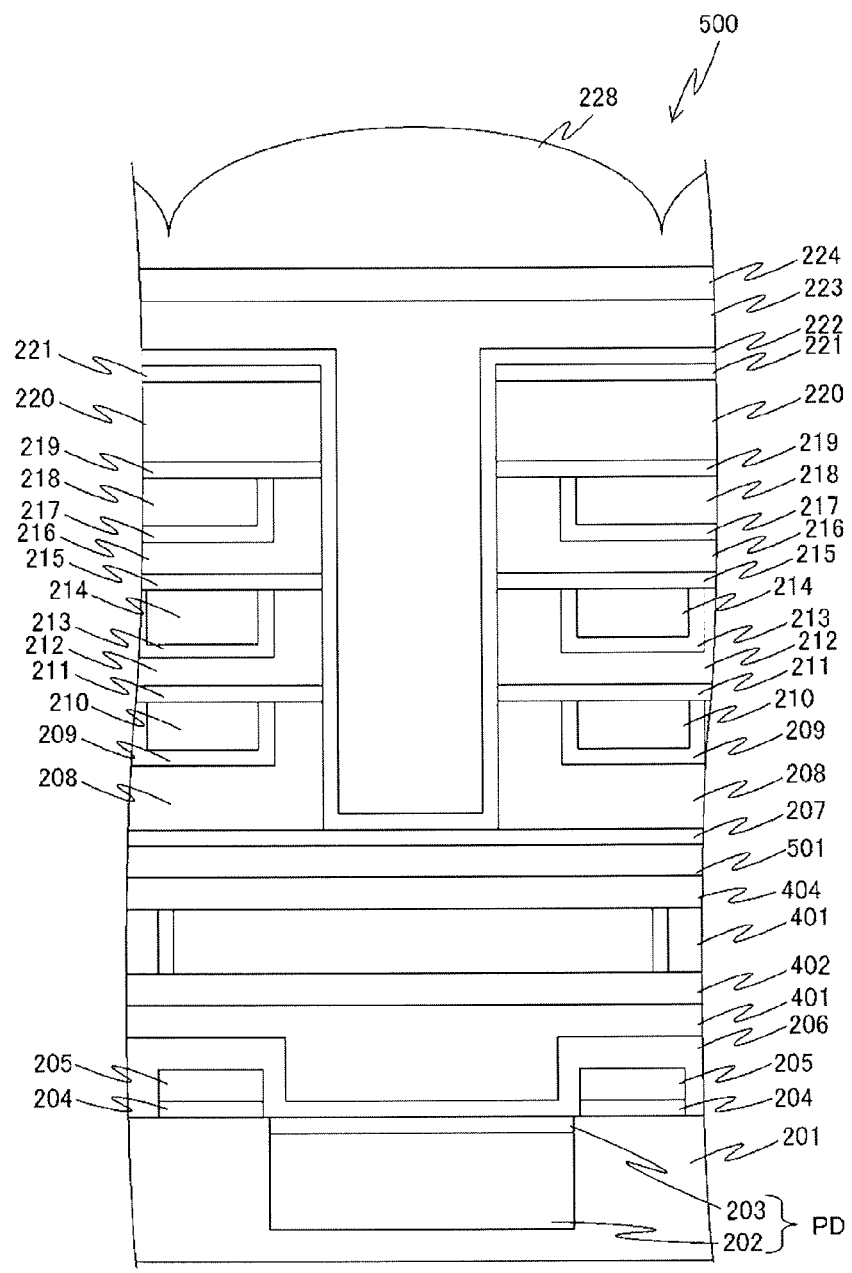
FIG. 14 is a diagram schematically illustrating a cross-sectional structure of a CMOS image sensor.

In a CMOS image sensor 500 illustrated in FIG. 14, an interlayer insulating film 501 is formed between the getter film 404 of the CMOS image sensor 400 according to the foregoing fifth embodiment and the etching stopper film 207. The interlayer insulating film 501 is formed of an SiN film or an SiON film as with the diffusion preventive films 16 and 18 in the foregoing first embodiment.

By providing the interlayer insulating film 501 as described above, diffusion of metal ions from the color filter 401 into the wiring layers and the like on the upper layer side is prevented more securely, and metal contamination is prevented.

3-5. Seventh Embodiment

Figure 15:
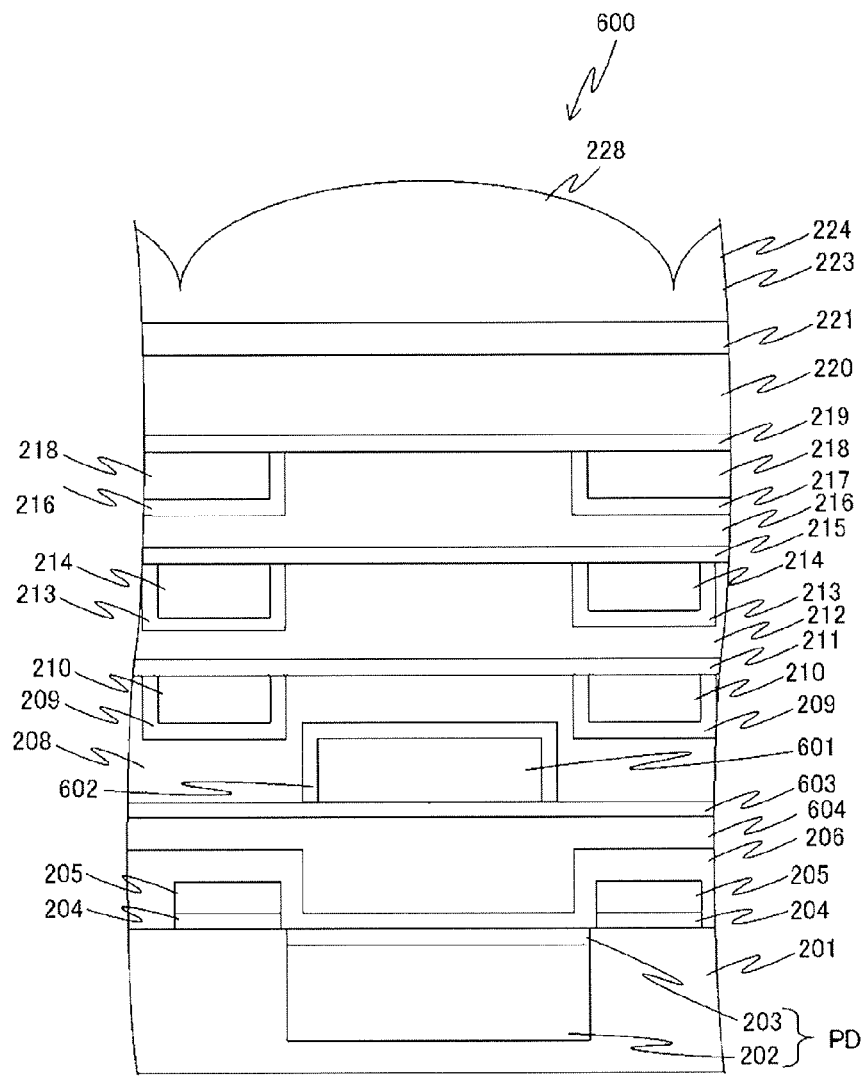
FIG. 15 is a diagram schematically illustrating a cross-sectional structure of a CMOS image sensor.

A CMOS image sensor 600 illustrated in FIG. 15 is obtained by not providing a light waveguide and providing the color filters 601 in the second interlayer insulating film 208 in the CMOS image sensor 200 according to the foregoing third embodiment.

Each of the color filters 601 of respective colors in the second interlayer insulating film 208 is individually formed between the on-chip lense and the photo-diode PD that correspond to each color. At this time, upper side surface and right and left side surfaces of each of the color filters 601 of the respective colors is covered with an insulating film 602, and thereby, diffusion of metal ions from the color filters 601 into the second interlayer insulating film 208 is prevented.

Further, in layers below the color filters 601, an interlayer insulating film 603 and a getter film 604 are formed in order between the color filters 601 and the first interlayer insulating film 206. The interlayer insulating film 603 and the insulating film 602 are formed of an SiN film or an SiON film as with the diffusion preventive films 16 and 18 in the foregoing first embodiment. The getter film 604 is formed of a BPSG film or a PSG film as with the getter film 15 in the foregoing first embodiment.

By providing the interlayer insulating film 603 and the getter film 604 as described above, diffusion of metal ions from the color filters 601 into the photodiodes PD on the lower layer side is prevented, and metal contamination is prevented.

3-6. Eighth Embodiment

Figure 16:
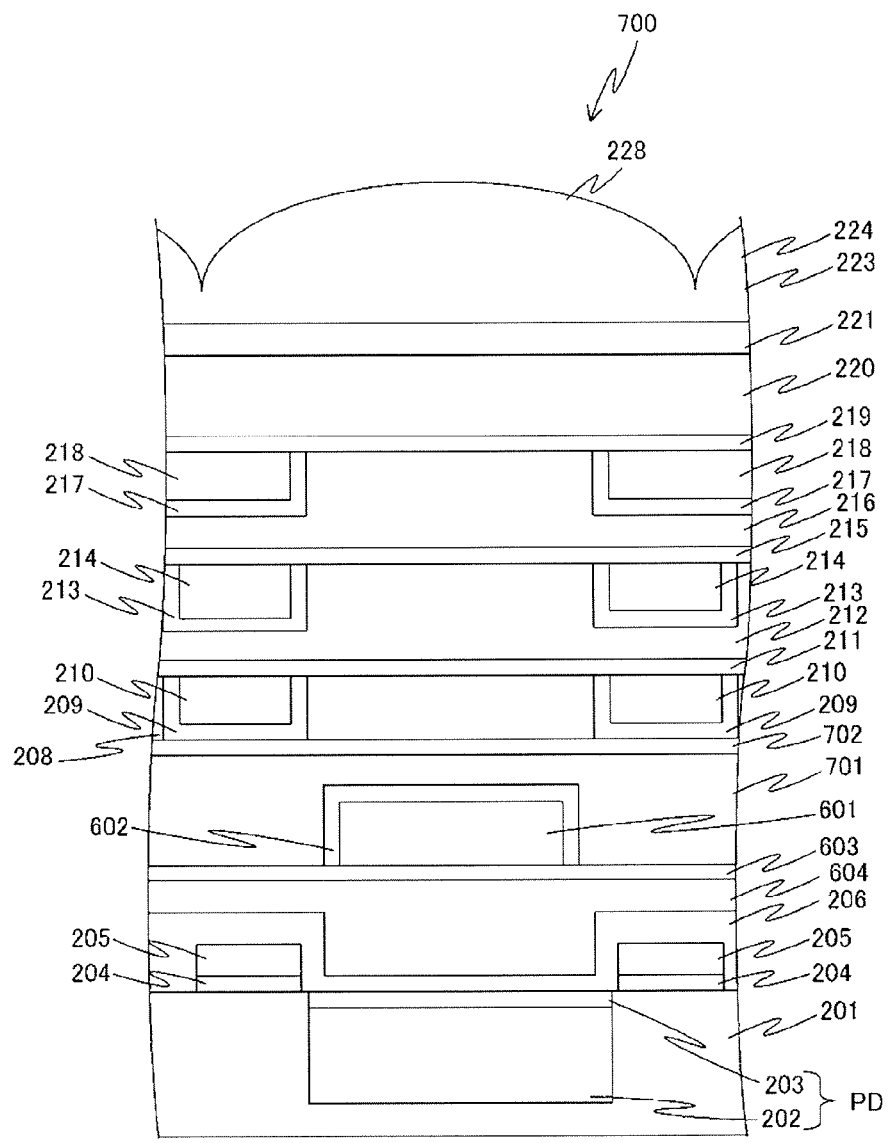
FIG. 16 is a diagram schematically illustrating a cross-sectional structure of a CMOS image sensor.

A CMOS image sensor 700 illustrated in FIG. 16 has a configuration in which a getter film 701 and an interlayer insulating film 702 are provided in order between the color filters 601 and the second interlayer insulating film 208 in the CMOS image sensor 600 according to the foregoing seventh embodiment.

The getter film 701 is formed of a BPSG film or a PSG film as with the getter film 15 in the foregoing first embodiment. The interlayer insulating film 702 is formed of an SiN film or an SiON film as with the diffusion preventive films 16 and 18 in the foregoing first embodiment.

By providing the getter film 701 and the interlayer insulating film 702 as described above, diffusion of metal ions from the color filters 601 into the second interlayer insulating film 208 and the first wiring 210 on the upper layer side is prevented, and metal contamination is prevented.

3-7. Ninth Embodiment

Figure 17:
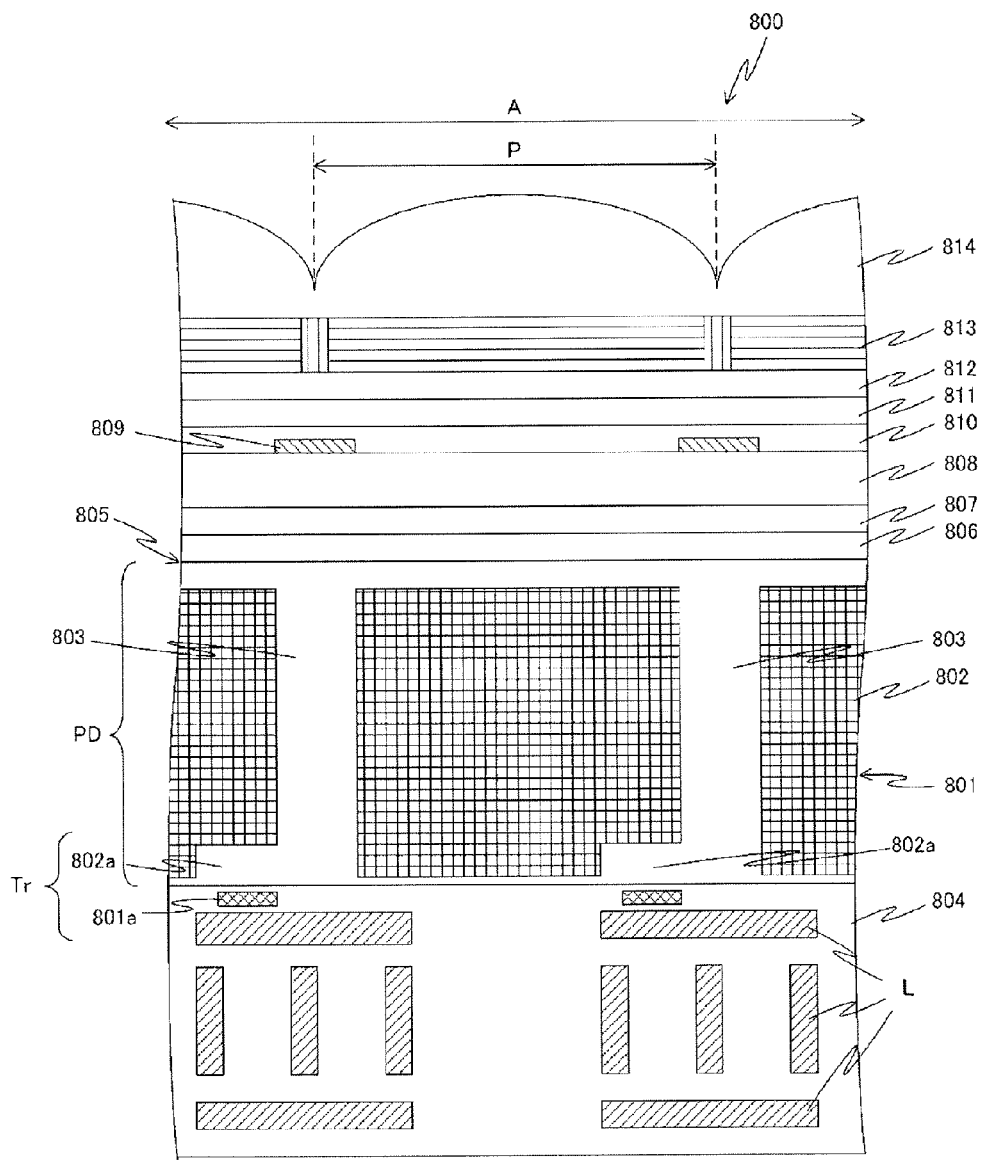
FIG. 17 is a diagram schematically illustrating a cross-sectional structure of a CMOS image sensor.

A CMOS image sensor 800 illustrated in FIG. 17 is a back-irradiating solid-state image pickup device. In the CMOS image sensor 800 illustrated in FIG. 17, for example, a pixel region A in which a plurality of pixels are arranged on a semiconductor substrate 801 made of a material such as silicon and an unillustrated peripheral circuit section arranged in the periphery of the pixel region A may be formed. In the peripheral circuit section, a logic circuit is formed.

A unit pixel P is configured of a photodiode PD to serve as a photoelectric conversion section and a plurality of pixel transistors Tr. The photodiode PD is formed to cover the entire area in a thickness direction of the semiconductor substrate 801, and is formed as a pn junction-type photodiode configured of an n-type semiconductor region 802 (first conductive type) and a p-type semiconductor region 803 (second conductive type). The p-type semiconductor region 803 is formed to approach both front and rear surfaces of the substrate, and also serves as an electric charge accumulation region to suppress a dark current.

The pixel transistor Tr is configured by forming an unillustrated n-type source and drain regions in a p-type semiconductor well region 802a formed on the front surface side of the semiconductor substrate 801; and forming a gate electrode 801a on the front surface of the substrate between the n-type source region and the n-type drain region with a gate insulating film in between. In FIG. 17, one pixel transistor Tr is illustrated as a representative for the plurality of pixel transistors, and the plurality of pixel transistors are schematically illustrated by the gate electrodes 801a.

On the front surface of the semiconductor substrate 801, a so-called multilayer wiring layer is formed. In the multilayer wiring layer, a plurality of layers of wirings L are arranged through an interlayer insulating film 804. Light does not enter the multilayer wiring layer side, and therefore, layout of the wirings L may be freely designed.

On the rear surface of the substrate to become a light-receiving surface 805 of the photodiode PD, an insulating film is formed. In this example, the insulating film is formed of a reflection preventive film. The reflection preventive film is formed of a plurality of layers of films having different refractive indices. In this example, the reflection preventive film is formed of a bi-layer film including a hafnium oxide ($HfO_2$) film 806 and a silicon oxide film 807.

On the reflection preventive film, an insulating film 808 is formed. In a pixel border on the insulating film 808, a light-blocking film 809 is formed. The type and the thickness of the insulating film 808 are set to optically-appropriate values. For example, the insulating film 808 may be preferably formed of a silicon oxide film, and the thickness thereof is set to a sufficiently larger value than at least the thickness of the reflection preventive film.

It is enough that the light-blocking film 809 is made of a material that blocks light. However, the light-blocking film 809 may be preferably formed of a metal film or an alloy film that has high light-blocking characteristics, and that are allowed to be finely processed, for example, may be allowed to be precisely processed by etching.

As the insulating film 808, it may be preferable to use a film having a large refractive index difference with respect to a high-refractive index film in an upper layer forming the reflection preventive film which may be, in this example, the hafnium oxide ($HfO_2$) film 806. For example, a silicon oxide film may be preferably used as the insulating film 808. For example, in the case where the insulating film 808 is formed of a silicon nitride (SiN) film having a refractive index close to that of the hafnium oxide ($HfO_2$) film, the thickness of the hafnium oxide film 806 is substantially thick, and the hafnium oxide film 806 becomes inappropriate as the reflection preventive film.

On the insulating film 808 including the light-blocking film 809, a planarizing film 810 is formed. On the planarizing film 810, an interlayer insulating film 811, a getter film 812, on-chip color filters 813, and on-chip micro lenses 814 are formed in order.

For example, the planarizing film 810 may be formed of an organic material such as a resin. As the on-chip color filters 813, for example, color filters with Bayer arrangement may be used. The on-chip color filters 813 may be made of an inorganic material as with the color filters 14 according to the foregoing first embodiment. Light received by the photodiodes PD enters the rear surface 805 side of the substrate, is collected by the on-chip micro lenses 814, and is received by the photodiodes PD through the on-chip color filters 813.

As described above, the color filter using the inorganic material according to any of the above-described embodiments of the present technology is also applicable to the back-irradiating CMOS image sensor 800 as in this embodiment.

3-8. Tenth Embodiment

Figure 18:
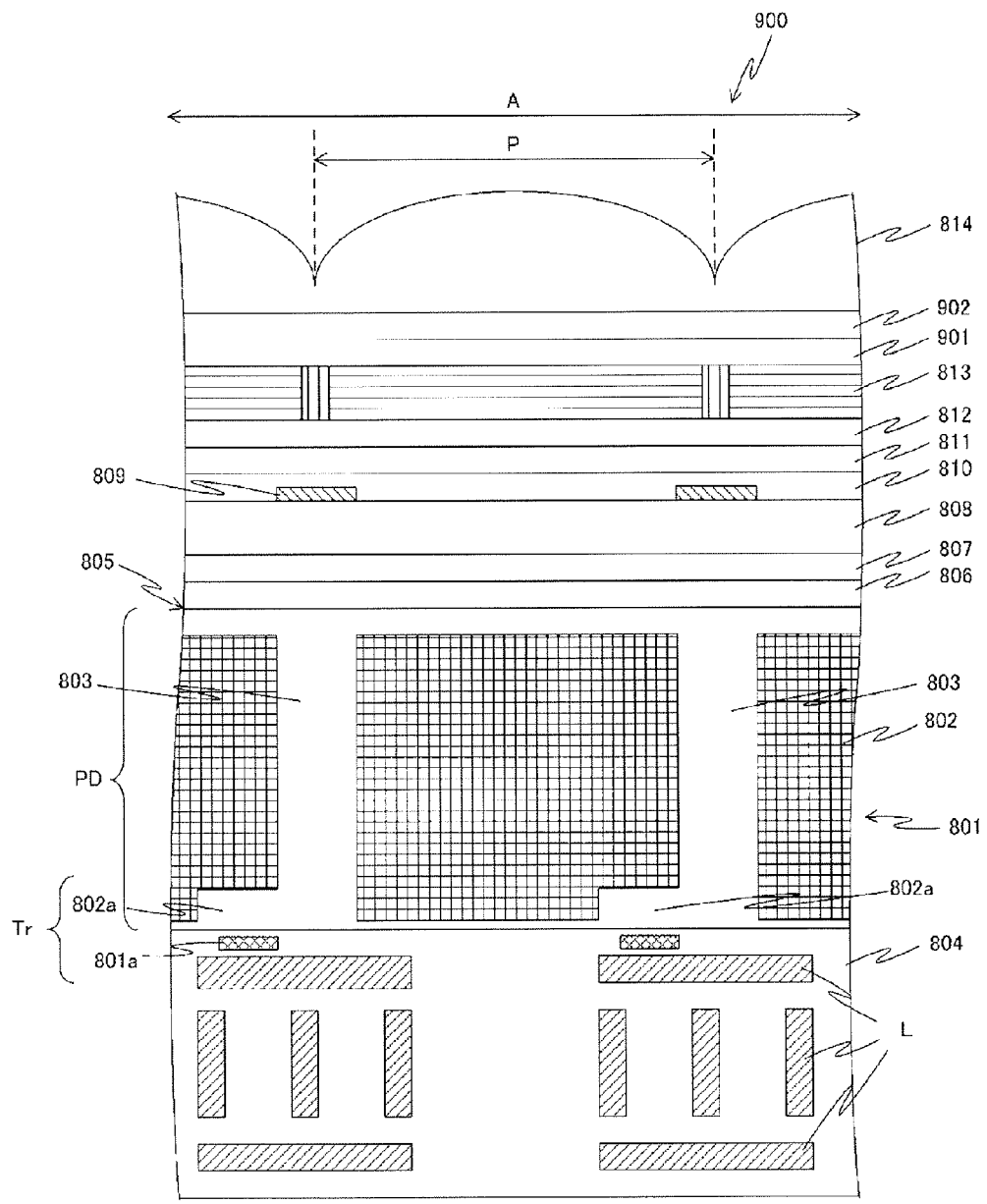
FIG. 18 is a diagram schematically illustrating a cross-sectional structure of a CMOS image sensor.

A CMOS image sensor 900 illustrated in FIG. 18 is a back-irradiating solid-state image pickup device as with the CMOS image sensor 800 according to the foregoing ninth embodiment. The CMOS image sensor 900 illustrated in FIG. 18 is different from the CMOS image sensor 800 in that the CMOS image sensor 900 includes an interlayer insulating film 901 and a getter film 902 between the on-chip color filters 813 and the on-chip micro lenses 814.

The getter film 902 is formed of a BPSG film or a PSG film as with the getter film 15 in the foregoing first embodiment. The interlayer insulating film 901 is formed of an SiN film or an SiON film as with the diffusion preventive films 16 and 18 in the foregoing first embodiment.

By providing the getter film 902 and the interlayer insulating film 901 as described above, diffusion of metal ions from the on-chip color filters 813 to the on-chip micro lenses 814 is prevented, and metal contamination is prevented. Therefore, the on-chip micro lenses 814 may be also made of an inorganic material as with the on-chip lenses 17 according to the foregoing first embodiment.

4. Conclusion

As described above, any of the semiconductor devices according to the embodiments of the present technology includes: the photoelectric conversion section made of a material such as semiconductor; the color filter made of an inorganic material to which a metal ion is added; and the getter film formed between the photoelectric conversion section and the color filter and configured to trap the metal ion. Therefore, diffusion of metal ions from the color filter formed by adding the metal ion to the inorganic material to the photoelectric conversion section is prevented, and metal contamination of the photoelectric conversion section is prevented.

It is to be noted that the present technology is not limited to the foregoing embodiments and the foregoing modifications. The present technology may include configurations obtained by substituting the respective components disclosed in the foregoing embodiments and the foregoing modifications by one another or changing combinations thereof; configurations obtained by substituting the respective components disclosed in the publicly-known technologies, the foregoing embodiments, and the foregoing modifications by one another or changing combinations thereof; and the like. Further, the technical scope of the present technology is not limited to the foregoing embodiments, and includes matters described in the scope of claims and equivalents thereof.

It is possible to achieve at least the following configurations from the above-described example embodiments and the modifications of the disclosure.

(A) A semiconductor device including:
  a photoelectric conversion section made of semiconductor;
  a color filter made of an inorganic material to which a metal ion is added; and
  a getter film formed between the photoelectric conversion section and the color filter and configured to trap the metal ion.
(B) The semiconductor device according to (A), wherein the getter film is one of a boron-phosphor-silicate-glass (BPSG) film and a phosphor-silicate-glass (PSG) film.
(C) The semiconductor device according to (A) or (B), further including a diffusion preventive film formed between the photoelectric conversion section and the color filter, the diffusion preventive film being configured to prevent diffusion of the metal ion.
(D) The semiconductor device according to any one of (A) to (C), wherein the diffusion preventive film is one of a silicon nitride film and a silicon oxynitride film.
(E) The semiconductor device according to any one of (A) to (D), further including:
  a plurality of the photoelectric conversion sections; and
  a plurality of transfer sections being alternately arranged with the plurality of the photoelectric conversion sections, wherein
  the color filter has a mound-like convex section with a projection amount gradually increasing from a portion corresponding to each of the transfer sections formed adjacently to the photoelectric conversion section.
(F) A method of manufacturing a semiconductor device, the method including:
  forming a photoelectric conversion section made of semiconductor;
  forming a color filter with use of an inorganic material to which a metal ion is added; and
  forming a getter film between the photoelectric conversion section and the color filter, the getter film being configured to trap the metal ion.
(G) The method according to (F), wherein, in the forming of the color filter, the color filter is made by crystallizing a metal-containing silicon oxide that is generated by a hydrolysis reaction between tetraalkoxysilane and metal alkoxide.

It should be understood by those skilled in the art that various modifications, combinations, sub-combinations and alternations may occur depending on design requirements and other factors insofar as they are within the scope of the appended claims or the equivalents thereof.

What is claimed is:
1. A semiconductor device comprising:
  photoelectric conversion sections made of a semiconductor material;
  color filters made of an inorganic material to which a metal ion is added;
  a getter film formed between the photoelectric conversion sections and the color filters and configured to trap the metal ion; and
  transfer sections being alternately arranged with the photoelectric conversion sections, wherein each of the photoelectric conversion sections has a first surface and an opposing second surface, wherein each of the transfer sections has a first surface and an opposing second surface, wherein each of the transfer sections has a third surface and an opposing fourth surface, wherein the first surface of each of the photoelectric conversion sections and the first surface of each of the transfer sections are in direct physical contact with the getter film, and wherein at least a portion of the third surface and the fourth surface of each of the transfer sections are in direct physical contact with the getter film.
2. The semiconductor device according to claim 1, wherein the getter film is one of a boron-phosphor-silicate-glass (BPSG) film and a phosphor-silicate-glass (PSG) film.
3. The semiconductor device according to claim 1, further comprising a diffusion preventive film formed between the photoelectric conversion sections and the color filters, the diffusion preventive film being configured to prevent diffusion of the metal ion.

4. The semiconductor device according to claim 3, wherein the diffusion preventive film is one of a silicon nitride film and a silicon oxynitride film.

5. The semiconductor device according to claim 3, further comprising a plurality of light blocking films, wherein the plurality of light blocking films is formed between the transfer sections and the diffusion preventive film.

6. The semiconductor device according to claim 1, wherein each of the color filters has a mound-like convex section with a projection amount gradually increasing from a portion corresponding to each of the transfer sections formed adjacently to the photoelectric conversion sections.

7. The semiconductor device according to claim 1, further comprising a plurality of light blocking films, wherein the plurality of light blocking films is formed at least partially between the plurality of transfer sections and the color filters.

8. A method of manufacturing a semiconductor device, the method comprising:
    forming photoelectric conversion sections made of a semiconductor material;
    forming color filters including an inorganic material to which a metal ion is added; and
    forming a getter film between the photoelectric conversion sections and the color filters, the getter film being configured to trap the metal ion; and
    forming transfer sections being alternately arranged with the photoelectric conversion sections, wherein each of the photoelectric conversion sections has a first surface and an opposing second surface, wherein each of the transfer sections has a first surface and an opposing second surface, wherein each of the transfer sections has a third surface and an opposing fourth surface, wherein the first surface of each of the photoelectric conversion sections and the first surface of each of the transfer sections are in direct physical contact with the getter film, and wherein at least a portion of the third surface and the fourth surface of each of the transfer sections are in direct physical contact with the getter film.

9. The method according to claim 8, wherein in forming the color filters, each of the color filters is made by crystallizing a metal-containing silicon oxide that is generated by a hydrolysis reaction between tetraalkoxysilane and metal alkoxide.

10. The method according to claim 8, wherein each of the color filters has a mound-like convex section with a projection amount gradually increasing from a portion corresponding to each of the transfer sections formed adjacently to the photoelectric conversion sections.

11. The method according to claim 8, further comprising:
    forming a diffusion preventive film between the photoelectric conversion sections and the color filters, the diffusion preventive film being configured to prevent diffusion of the metal ion.

12. The method according to claim 11, further comprising:
    forming a plurality of light blocking films, wherein the plurality of light blocking films is formed at least partially between transfer sections and the diffusion preventive film.

13. The method according to claim 8, further comprising:
    forming a plurality of light blocking films, wherein the plurality of light blocking films is formed at least partially between the transfer sections and the color filters.

* * * * *